United States Patent [19]

Bryant et al.

[11] Patent Number: 4,863,562
[45] Date of Patent: Sep. 5, 1989

[54] METHOD FOR FORMING A NON-PLANAR STRUCTURE ON THE SURFACE OF A SEMICONDUCTOR SUBSTRATE

[75] Inventors: Frank R. Bryant, Denton; Fu-Tai Liou, Carrollton, both of Tex.

[73] Assignee: SGS-Thomson Microelectronics, Inc., Carrollton, Tex.

[21] Appl. No.: 155,148

[22] Filed: Feb. 11, 1988

[51] Int. Cl.$^4$ ................... H01L 21/306; H01L 21/95
[52] U.S. Cl. .................... 156/649; 156/662; 437/62; 437/228
[58] Field of Search ............. 437/62, 69, 70, 72, 437/73, 228; 156/643, 649, 662; 148/DIG. 86, DIG. 114, DIG. 117

[56] References Cited

U.S. PATENT DOCUMENTS

| | | | |
|---|---|---|---|
| 4,272,308 | 6/1981 | Varshney | 437/73 X |
| 4,292,156 | 9/1981 | Matsumoto et al. | 437/73 X |
| 4,583,281 | 4/1986 | Ghezzo et al. | 156/643 X |
| 4,692,996 | 9/1987 | Minato | 437/73 |

FOREIGN PATENT DOCUMENTS

| | | | |
|---|---|---|---|
| 3400590 | 9/1984 | Fed. Rep. of Germany | 437/73 |
| 58-15247 | 1/1983 | Japan | 437/73 |
| 59-202648 | 11/1984 | Japan | 437/73 |
| 61-196549 | 8/1986 | Japan | 437/73 |

Primary Examiner—David L. Lacey
Assistant Examiner—Andrew J. Anderson
Attorney, Agent, or Firm—Robert D. Lott; Richard K. Robinson

[57] ABSTRACT

A method for increasing the width of a transistor includes first forming a nitride cap (14) over the substrate (10) and then forming trenches (24) and (26) on either side of the cap (14) and having tapered sidewalls (28) and (30). A conformal layer of nitride (32) is formed over the substrate and then anisotropically etched to form sidewall layers (34) and (36). Field oxide is grown in the trenches with birds beaks (42) and (44) extending upward under the sidewall layers (34) and (36). A portion of the sidewalls (28) and (30) of the trenches remain such that the overall surface area between the edges of the birds beaks (42) and (44) is increased. A layer of strip oxide is then grown on the substrate to provide rounded edges (47) and (49). The strip oxide is then removed by a fifty percent over etch to cause the birds beaks (42) and (44) to recede, thus further increasing the surface area. The gate electrode of a transistor (54) can then be disposed thereacross, thus increasing the width of the transistor for a given silicon surface area in the initial material.

3 Claims, 3 Drawing Sheets

METHOD FOR FORMING A NON-PLANAR STRUCTURE ON THE SURFACE OF A SEMICONDUCTOR SUBSTRATE

TECHNICAL FIELD OF THE INVENTION

The present invention pertains in general to semiconductor structures, and more particularly to a method for forming a nonplanar surface on a semiconductor substrate to increase surface area and fabricating an MOS structure on the non-planar surface.

BACKGROUND OF THE INVENTION

Integrated circuits in recent years have seen great advances in processing technology and photolithographic techniques, which has resulted in the ability to fabricate more complex and higher density devices. To realize these higher density devices, present technology has provided submicron line definition for defining the various structures on the integrated circuit. However, industry's need for increased density devices has far outdistanced the ability to realize this density with present techniques. This is due in part to the fact that most conventional processes utilize planar techniques with the structures defined in a two dimensional space.

In order to increase density with present processing technology and photolithographic techniques, process designers have resorted to vertical integration to more effectively utilize the available space. One vertical integration technique is to stack active devices on already processed devices. This stacking procedure requires the formation of a layer of silicon on the top of an already formed active device. A second level of active circuitry is then defined in this second layer. Although this type of technology significantly increases the density, it does present a problem with respect to forming contact holes and interconnects between the various levels in addition to increasing the complexity of the process.

Another vertical integration technique that has been successfully utilized is trenching whereby trenches are formed in the substrate and active circuits or capacitors formed on the sides and bottom of the trench. The trenching technology has come into widespread use with respect to dynamic random access memory cells having a density of one Megabit or more. Trenches can either be vertical wall trenches or "V" shape trenches for use with the VMOS technology. Although the vertical integration techniques have provided increased density, there are limitations to the present techniques.

The components that are most widely utilized in high density integrated circuits are the MOS transistor and the MOS capacitor. In order to improve operation of a capacitor, it is only necessary to increase its surface area or decrease the distance between the electrodes to increase capacity. Additionally, the depletion capacitance in a non-inversion type capacitor can be increased through use of an implanted region under the capacitor to provide the Hi-C capacitor. However, a transistor requires some additional considerations since there are numerous operational parameters to account for. For example, conventional MOS transistors have a width dimension which defines the overall width of the source and drain regions, and a length dimension which defines the channel length of the transistor. The operational parameters of the transistor are dependent on these geometries.

Typically, during fabrication of an MOS transistor, a moat is defined in a substrate with the width of the moat corresponding to the width of the transistor. A gate oxide layer and gate electrode are then deposited on the substrate along the full width of the transistor, the width of the gate electrode defining the channel length. Source and drain regions are then defined on either side of the gate along the entire width of the transistor. The dimensions of the source and drain regions perpendicular to the gate are selected for purposes of contacting thereto. In a planar structure, if a wider transistor is required, more two dimensional space is needed.

There are certain limitations on transistors which are size limited and which are a function of the width-to-length ratio. These are, for example, gain, speed and power handling capability. There are limits to scaling down these devices since scaling down may degrade performance. Thus far, the vertical integration process technology has not specifically addressed the transistor. Therefore, there exists a need for a process technology that will increase the packing density for a given transistor without unduly scaling down the device.

SUMMARY OF THE INVENTION

The present invention disclosed and claimed herein comprises a method for increasing the surface area of a semiconductor substrate. The method includes the steps of first forming trenches in the surface of the semiconductor substrate, the trenches having sidewalls and a bottom surface. The sidewalls define the boundaries of the active region. A protective sidewall layer is then formed over the surface of the sidewalls and the trenches. A layer of thermal oxide is then grown in the trenches from the bottom extending upward therefrom. A birds beak is formed during formation of the layer of thermal oxide that extends upward between the sidewalls and the protective sidewall layers and extending only a portion of the way up the sidewall. The sidewall layer is then removed with the portion of the sidewall uncovered by the birds beak increasing the surface area of the active region.

In yet another embodiment of the present invention, the sidewalls are tapered outward from the upper surface to the bottom of the trenches to provide a more arcuate edge for the active region. The trenches are formed by first depositing a protective capping layer over the substrate that is resistant to oxidation and then patterning this protective capping layer to define the boundaries of the trenches. The trenches are then etched into the substrate to a predetermined distance. The capping layer can be varied in thickness such that the actual surface of the substrate at the boundaries of the trenches is larger than the patterned surface area along the upper surface of the protective capping layer.

In yet another embodiment of the present invention, a transistor is formed on the active region by first forming a layer of gate oxide to a predetermined thickness over the active region. A layer of conductive material is then formed over the gate oxide layer followed by patterning of the combined conductive material and gate oxide layer to form a gate electrode. The gate electrode extends from one side of the active region to the other side thereof to define a channel region underlying the gate electrode. The ends of the gate electrode traverse down the sidewalls and up over the layer of thermal oxide in the trenches on at least one end thereof to provide a transistor with an increased width. Source and drain regions are formed on either side of the channel.

In yet a further embodiment of the present invention, an MOS capacitor is formed on the active region. The MOS capacitor is formed by first forming a layer of capacitor oxide over the substrate followed by formation of an upper electrode over the substrate and the capacitor oxide layer. A conductive interconnect is then provided to the active region to contact the portion of the active region underlying the layer of capacitor oxide to provide the second electrode of an inversion type capacitor.

DETAILED DESCRIPTION OF THE DRAWINGS

For a more complete understanding of the present invention and the advantages thereof, reference is now made to the following description taken in conjunction wit the accompanying Drawings in which.

DETAILED DESCRIPTION OF THE INVENTION

Figure 1:
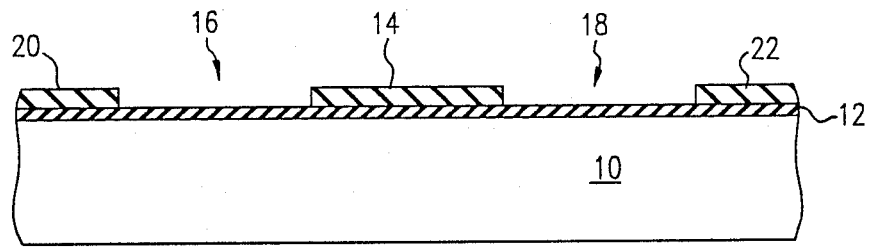
FIG. 1 illustrates a cross-sectional diagram of a substrate with a nitride pattern defined thereon.

Referring now to FIG. 1 there is illustrated a cross-sectional diagram of a substrate 10, which, in the preferred embodiment, is comprised of silicon. The substrate 10 has a layer of silicon oxide 12 formed on the upper surface thereof to a thickness of approximately 300 Å. The silicon oxide layer 12 is formed by subjecting the substrate to a thermal oxidation treatment in an oxygen atmosphere at a temperature of approximately 1,000° C. After formation of the silicon oxide layer 12, a layer of silicon nitride ($Si_3N_4$) is deposited on the upper surface of the layer 12 by ordinary chemical vapor deposition (CVD) techniques. The growth of the $Si_3N_4$ is carried out at a temperature of approximately 800°-900° C. for a predetermined period of time. Thereafter, a layer of photoresist is formed on the upper surface of the $Si_3N_4$ layer and then the layer patterned, resulting in a nitride cap 14 which has two open regions 16 and 18 formed on either side thereof. Open regions 16 and 18 are bounded on the opposite side from the nitride cap 14 by nitride caps 20 and 22, respectively.

Figure 2:
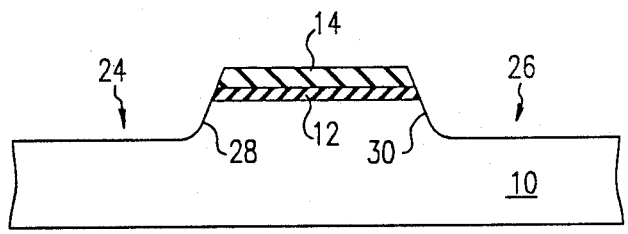
FIG. 2 illustrates a cross-sectional diagram of the substrate of FIG. 1 wherein trenches are defined on the portions of the substrate not covered by the nitride capping layer.

Referring now to FIG. 2, after formation of the nitride caps 14, 20 and 22, the open regions 16 and 18 are etched with a fluorine etch which is anisotropic in nature. This results in trenches 24 and 26 formed on either side of the nitride cap 14 in regions 16 and 18, respectively. The depth of trenches 24 and 26 is between 2,000 Å and 5,000 Å. The trench 24 has a tapered edge 28 adjacent the nitride cap 14 and the trench 26 has a tapered edge 30 adjacent the nitride cap 14. Although the edges 28 and 30 could be vertical in nature, for purposes of manufacturing a transistor as described in the preferred embodiment, tapered edges are desirable.

In the preferred embodiment, the trenches 24 and 26 are formed with the tapered edges 28 and 30 having a tapered profile. This taper has an angle that is a function of the etch process. In the preferred embodiment, the etch is a plasma etch which uses a LAM 580 machine with a 600 watt voltage across plates that are spaced approximately 0.5 centimeters. The pressure is 0.5 Torr with a flow rate of a $C_2F_6$ gas at a flow rate of 50 cc/min followed by a gas $CHF_3$ at a flow rate of 15 cc/min. The total etch time is approximately 2.5 minutes. However, it should be understood that by varying the flow rates of the gases and both power and plate spacing, the angle can be varied.

Figure 3:
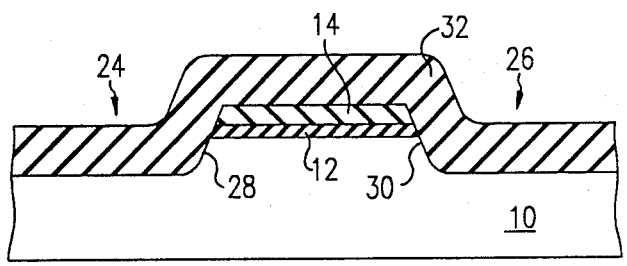
FIG. 3 illustrates a cross-sectional diagram of the substrate of FIG. 2 with a conformal layer of nitride formed thereon.
Figure 4:
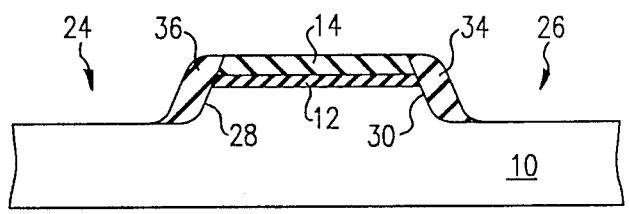
FIG. 4 illustrates a cross-sectional diagram of the substrate of FIG. 3 after an anisotropic etch to leave a nitride layer on the sidewalls of the trench.

Referring now to FIG. 3, after the formation of the trenches 24 and 26, a conformal layer of silicon nitride 32 is deposited on the substrate by CVD techniques. The silicon nitride layer 32 is approximately 2,500 Å in thickness. The substrate is then subjected to an anisotropic etch ($SiF_6$) to remove the portions of the layer 32 that cover planar surfaces as illustrated in FIG. 4. This effectively removes the silicon nitride layer 32 from the upper surface of the nitride cap 14 and also from the bottom of the trenches 24 and 26. The anisotropic etch also etches some of the upper surface of the nitride cap 14. A sidewall nitride layer 34 of silicon nitride remains overlying tapered edge 30 and a sidewall nitride layer 36 remains over tapered edge 28.

In the preferred embodiment, the etch utilizes the LAM 580 machine with a pressure of 0.2 Torr and a plate spacing of 1.5 centimeters at a power of 100 watts. The gas $SiF_6$ has a flow rate of 50 cc/min with a ballast gas of He at a flow rate of 10 cc/min. The etch time is approximately 2.0 minutes.

Figure 5:
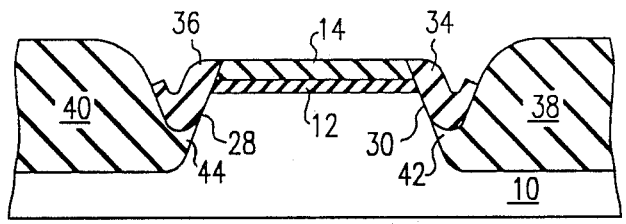
FIG. 5 illustrates a cross-sectional diagram of the substrate of FIG. 4 with a field oxide layer grown in the trenches.

Referring now to FIG. 5, after formation of the sidewall nitride layer 34 and 36, the substrate is subjected to a steam oxidation process at approximately 900°-1,000° C to form oxide layers 38 and 40 at the bottom of trenches 26 and 24, by consuming silicon at the bottom thereof to form silicon dioxide. The oxide layers 38 and 40 provide an isolation function and these layers are typically referred to as the field oxide. The region between the field oxide is generally referred to as a "moat", which structure provides an active region in which to form active devices wherein the field oxide layers 38 and 40 provide isolation between the various components on the substrate.

During formation of the field oxide layers 38 and 40 by the oxidation process, silicon is consumed at the fastest rate at the middle of the trenches 24 and 26 with oxide being formed in an upward direction at a faster rate than at the downward direction in the silicon. Additionally, the rate of oxidation at the interface of he nitride sidewall layer 36 and the nitride sidewall layer 34 with respect to the bottom of the trenches 24 and 26, respectively, is slower than at the center of the trench. During the oxidation process, the edge of the nitride sidewall layers 34 and 36 is lifted up by the oxidation process. This is referred to as a channeling effect wherein oxygen is channeled up between the silicon and the nitride sidewall layers 34 and 36. This results in a "birds beak" 42 formed under the nitride sidewall layer 34 and a "birds beak" 44 formed under the nitride sidewall layer 36. The birds beaks 42 and 44 are directed upward along the tapered edges 28 and 30, but extend only a portion of the way up the tapered surfaces 28 and 30. The extent to which the birds beaks 42 and 44 extend upward along the tapered surfaces 28 and 30 is controlled by the duration of time that the substrate 10 is subjected to the steam oxidation process. In the preferred embodiment, the oxide layers 38 and 40 are approximately 7,000 Å thick.

Figure 5A:
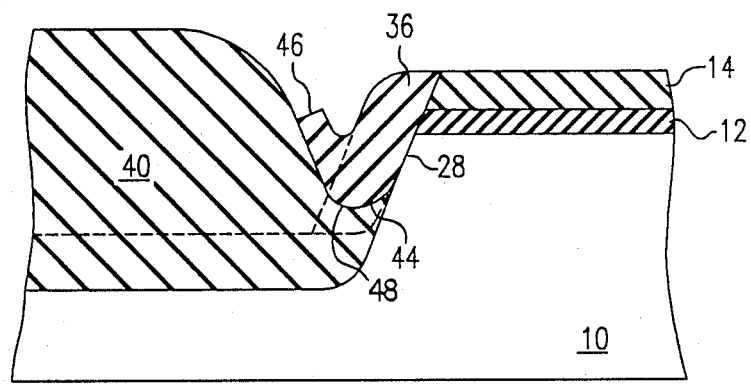
FIG. 5a illustrates a detail of the sidewall of the trench of FIG. 5.

Referring to FIG. 5a, there is illustrated a detail of the birds beak 44 formed under the nitride sidewall layer 36, wherein like numerals refer to like parts in the various figures. The bottom of the trench 24 and the original position of the nitride sidewall layer 36 proximate thereto are illustrated in phantom lines. It can be seen from the phantom lines that the tip of the sidewall oxide layer referred to by reference numeral 46 is lifted away from the lowermost portion of the tapered edge 28. The actual lifting up of the edge 46 results in an arcuate surface 48 being formed between the sidewall nitride layer 36 and the field oxide layer 40. As will be described hereinbelow, this curvature is important from the standpoint of depositing a conformal layer thereon. It should be noted that the birds beak 44 does not extend up the tapered edge 28 the entire way. It is necessary to have a substantial portion of the tapered edge 28 remaining uncovered by oxide.

Figure 6:
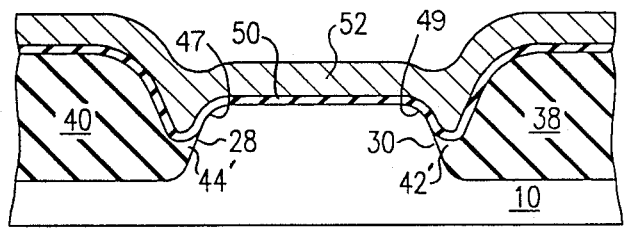
FIG. 6 illustrates a cross-sectional diagram of the substrate of FIG. 5 with a layer of polysilicon formed thereon and overlying a gate oxide layer.

Referring now to FIG. 6, after the field oxide layers 38 and 40 are grown, a hot phosphoric acid is utilized to remove the silicon nitride and then HF used to remove the oxide layer 12 down to the virgin silicon. After the silicon nitride and the oxide layer 12 are removed down to virgin silicon, a dummy layer of strip oxide (not shown) is grown over the silicon to a thickness of approximately 1,000 Å. The step of growing the strip oxide has the effect of rounding the corners which are referred to by reference numerals 47 and 49. This is due to the fact that the operation of growing the strip oxide layer to a thickness of 1,000 Å results in consumption of approximately 500 Å of silicon on the flat surfaces. However, at a sharp edge there is an abundance of oxygen available for the oxidation process, and, therefore, oxidation occurs at a faster rate resulting in the consumption of additional silicon as compared to consumption of silicon on a flat surface.

After the strip oxide layer is formed on the surface of the substrate, the substrate is subjected to a wet etch to remove the strip oxide layer with approximately a fifty percent over etch. This fifty percent over etch is important in that it removes a portion of the birds beaks 42 and 44. This is due to the fact that the wet etch is operable to only remove the thermally grown oxide which is achieved after a period of time required to etch 1,000 Å. However, by over etching, a portion of the birds beaks 42 and 44 is removed, thus resulting in the tip of the birds beaks 42 and 44 receding down along the sidewalls 28 and 30. This results in birds beaks 42' and 44', thus resulting in an increase in the overall surface area due to the increased exposure of silicon on the sidewalls 28 and 30. Thereafter, a layer of silicon oxide 50 is thermally grown on the substrate to a thickness of approximately 200 Å, which layer functions as the gate insulator or gate oxide for the MOS transistor. A layer of polycrystalline silicon 52 is then deposited by CVD techniques onto the oxide layer 50 to a thickness of approximately 4,000-5,000 Å. It can be seen that the conductive surface of the silicon extending between the field oxide layers 38 and 40 and down the remaining portions of the tapered edges 28 and 30 provides a surface that is not planar. Therefore, for a given x-y dimension on the surface of a substrate, the overall surface area has been increased between the birds beaks 42 and 44. Due to the processing steps, the edge of the active area between the sidewalls 28 and 30 and the upper surface is arcuate. As the distance between the sidewalls 28 and 30 decreases, the overall surface resembles a rounded bulge.

Figure 7:
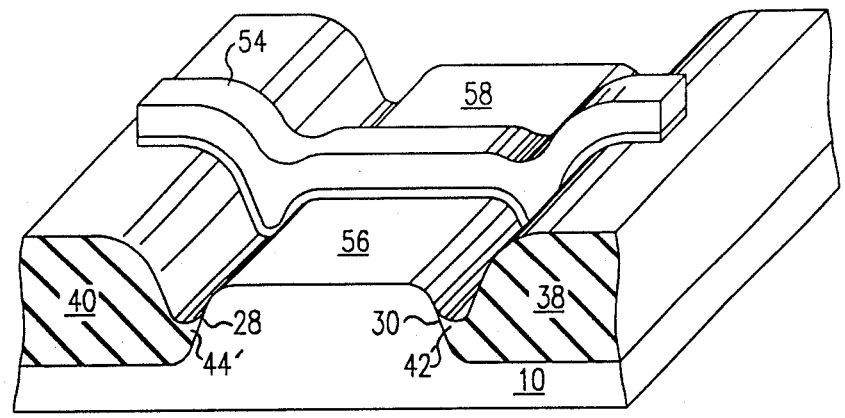
FIG. 7 illustrates a perspective view of a transistor gate defined in the poly layer.

Referring now to FIG. 7, after formation of the poly layer 52, the gate of the transistor is patterned which extends lengthwise between the birds beaks 42 and 44 and up over the field oxide layers 38 and 40 to provide contact surfaces therewith. The gate of the transistor is referred to by reference numeral 54. After formation of the gate 54, the source and drain junctions are implanted with an impurity type opposite to that of the substrate 10. For example, if the substrate 10 were of a p-type conductivity, n-type impurities would be implanted into the substrate on either side of the gate 54. This would be what is conventionally termed a "self-aligned" process whereby the edges of the gate 54 provide alignment of the source/drain junctions with the channel region of the transistor, which channel region underlies the gate 54. However, any process can be utilized for forming the source and drains of the transistor and the gate electrode 54. The source of the transistor is referred to by reference numeral 56 and the drain of transistor is rfferred to by reference numeral 58.

It can be seen from the perspective view of FIG. 7 that the overall width of the transistor is increased due to the remaining portions of the tapered edges 28 and 30 that extend downward from the surface of the substrate. This provides a "bulge" in the surface over which the gate electrode 54 lies. At a point proximate to the birds beaks 42 and 44, the gate electrode 54 will follow the contour of the substrate, thus increasing the length of the gate, and consequently, the width of the transistor. It should be understood that the tapered edge 28 and the tapered edge 30 provide a surface which is more arcuate in nature than a vertical edge. A vertical edge would be somewhat undesirable for the gate of the transistor since the fields generated at a sharp edge would significantly affect the operating parameters of the transistors.

Figure 8:
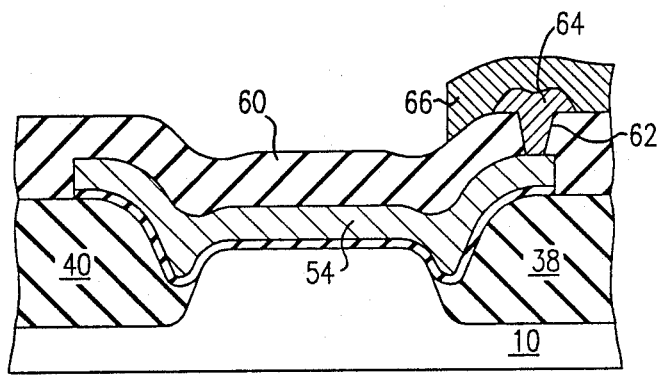
FIG. 8 illustrates a cross-sectional diagram of a completed transistor.

Referring now to FIG. 8, after formation of the gate electrode 54 and the source and drain regions 56 and 58, the transistor is covered by a layer of interlevel oxide 60 and then a contact opening 62 formed through the interlevel oxide layer 60 and a conductive plug 64 formed therein. A metal layer 66 is then formed over the surface of the interlevel oxide layer 60 and patterned to provide a conductive interconnection between other circuitry on the substrate. Generally, it is desirable to make the contact to the gate electrode 54 over the field oxide layer 38 or 40.

Figure 9:
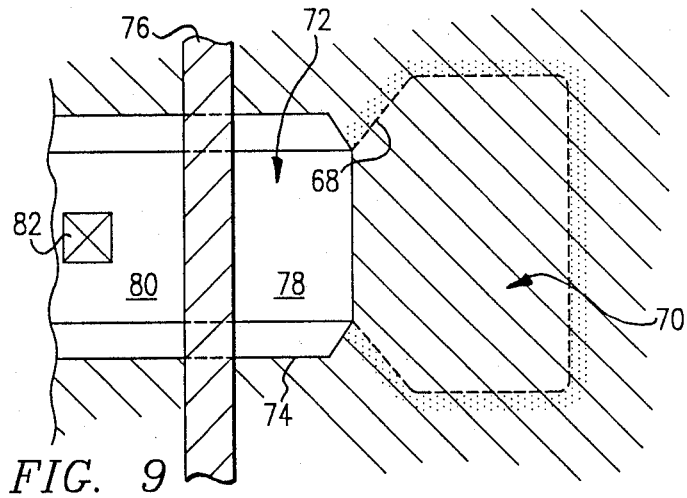
FIG. 9 illustrates an alternate embodiment illustrating a capacitor and transistor formed by the method of the present invention.

Referring now to FIG. 9, there is illustrated a top-view of an alternate method for forming the transistor, wherein the transistor is combined with a capacitor in a structure such as a one transistor memory cell. The device is fabricated by first forming a moat which is defined by a boundary 68 which has contained therein a capacitor region 70 and an active region 72. The capacitor region 70 can be implanted to form a depletion type capacitor or remain undoped to form an inversion type capacitor. The active region 72 is utilized to form the transistor. The moat defined by the boundary 68 is fabricated similar to the above process described with respect to FIGS. 1-8. The boundary 68 comprises the edge of a birds beak similar to birds beaks 42 and 44. Therefore, a trench would be formed outside the boundary 68 and then a field oxide layer formed therein.

After formation of the capacitor region 70 and active region 72, a first layer of polycrystalline silicon is formed thereover and patterned to cover the capacitor region 70 and leave exposed the active region 72. The first layer of polycrystalline silicon is defined outside of a boundary 74. A layer of interlevel oxide is then disposed over the substrate and the active region 72 again exposed. This is followed by formation of the gate oxide layer and then deposition of a second layer of poly. The second layer of poly is patterned to define a gate conductor 76 on the second level. Thereafter, a source implant 78 is disposed between the gate 76 and the capacitor region 70, which source 78 is masked by both the gate electrode 76 and the boundary 74. The source implant 78 provides an interconnect to the lower plate of the capacitor which can either be an implanted region or an inversion region. A drain 80 is formed on the opposite side of the gate electrode. Thereafter, a bit line contact 82 can be formed.

It can be seen from the structure of FIG. 9 that the boundary 68 defines an increased surface area which provides an advantage to the capacitor wherein the capacitor oxide which underlies the first layer of poly and the portion of the first layer overlying the gate oxide layer provide an increased surface area. A cross section of the capacitor region 70 after formation thereof would appear similar to the cross sectional diagram of FIG. 6.

In summary, there has been described a process for forming a semiconductor device over a surface that is not planar with respect to the silicon surface. The process includes first forming a nitride mask to define the active areas of the substrate. Trenches are then defined along the side of the nitride mask and then a conformal sidewall layer of nitride is deposited along the sidewalls of the trenches. A field oxide is then grown from the bottom surface of the trenches such that a birds beak is formed at the lowermost end of the sidewall nitride and lifts up the end of the sidewall nitride. The birds beak extends part way up the tapered edges of the trench such that a portion of the tapered edge remains in silicon. The nitride cap is then removed leaving a conductive surface that has an increased surface area between the boundaries of the birds beak of the field oxide layer strip. Thereafter, a semiconductor structure such as the gate of a transistor can be disposed on the active area, which results in a transistor with an increased width.

Although the preferred embodiment has been described in detail, it should be understood that various changes, substitutions and alterations can be made therein without departing from the spirit and scope of the invention as defined by the appended claims.

What is claimed is:

1. A method for increasing the surface area of an active region on a semiconductor substrate, comprising:
    forming a protective cap that is resistant to oxidation over a select area on the substrate to define a first two-dimensional boundary, the protective cap having a predetermined thickness;
    forming trenches in the surface of the substrate having a bottom surface and sidewalls that extend downward from the periphery of the first two-dimensional boundary to the bottom surface;
    forming a protective layer of silicon nitride on the sidewalls of the trenches;
    thermally growing a layer of thermal oxide in the trenches from the bottom surface upwards such that a birds beak is formed on each of the sidewalls extending upward from the bottom of the associated trench along the sidewall between the sidewall and the protective nitride capping layer such that the birds beak on each of the sidewalls extends only a portion of the way up the sidewall with the outermost edge of the birds beak defining a second boundary below the first two dimensional boundary wherein the surface area of the active region comprises the surface area within the first two-dimensional boundary and the surface area of the portion of the sidewalls not covered by the layer of thermal oxide;
    removing the silicon nitride layer on the sidewalls and the protective cap;
    thermally growing a layer of strip oxide over the upper surface of the active region and the exposed semiconductor material on the sidewalls such that semiconductor material is consumed to form the strip oxide layer, the consumption of semiconductor material occurring at a faster rate at the junction between the upper surface of the active region and the sidewalls to provide a rounding of the edge; and
    removing the strip oxide layer with a wet etch such that the wet etch continues for a period of time exceeding the time to remove the thickness of the strip oxide layer wherein a portion of the birds beak is removed such that the birds beak recedes downward along the sidewalls away from the upper surface of the active region to effectively increase the surface area thereof.

2. The method of claim 1 wherein the semiconductor material is silicon and the layer of strip oxide is silicon oxide.

3. The method of claim 1 wherein the wet etch is performed for a duration of time to over-etch the strip oxide layer by approximately fifty percent.

* * * * *